United States Patent [19]
Rejman-Greene et al.

[11] Patent Number: 5,412,226
[45] Date of Patent: May 2, 1995

[54] SEMI-CONDUCTOR STRUCTURES

[75] Inventors: Marek A. Z. Rejman-Greene, Ipswich; Edward G. Scott, Hadleigh, both of United Kingdom

[73] Assignee: British Telecommunications public limited company, London, England

[21] Appl. No.: 321,473

[22] Filed: Oct. 11, 1994

Related U.S. Application Data

[63] Continuation of Ser. No. 858,971, May 20, 1992, abandoned.

[30] Foreign Application Priority Data

Nov. 20, 1989 [GB] United Kingdom ............... 8926183

[51] Int. Cl.⁶ ................. H01L 29/161; H01L 21/20
[52] U.S. Cl. ........................ 257/21; 257/13; 257/14; 257/96
[58] Field of Search ........ 257/14, 15, 16, 17, 257/18, 19, 20, 21, 506, 507, 523, 524, 281, 96, 14–21, 506, 507, 523, 524, 105, 107, 126, 281; 437/105, 107, 126; 359/248

[56] References Cited

U.S. PATENT DOCUMENTS

| | | | |
|---|---|---|---|
| 4,205,331 | 5/1980 | Esaki et al. | 257/21 |
| 4,814,847 | 3/1989 | Tabatabale | 357/30 |

FOREIGN PATENT DOCUMENTS

| | | |
|---|---|---|
| 0323073 | 7/1989 | European Pat. Off. . |
| 1293657 | 11/1989 | Japan . |
| 43109 | 8/1992 | Japan . |

OTHER PUBLICATIONS

Electronics Letters, 17th Jul. 1980, vol. 16, No. 15, "GaAs-GaAlAs Phototransistor/Laser Light Amplifier", Beneking et al., pp. 602 & 603.
Electronics Letters, 8th Dec. 1988, vol. 24, No. 25, "Planar 3×3 Array . . . by Gas-Source MBE", Rejman-Greene et al., pp. 1583 & 1584.
Electronics Letters, 27th Apr. 1989, vol. 25, No. 9, "5—5 GHz Multiple Quantum Well Reflection Modulator", Boyd et al., pp. 558 & 559.
Electronics Letters, 27th Apr. 1989, vol. 25, No. 9, "High-Contrast Reflection . . . Fabry-Perot Structure", Whitehead et al., pp. 566–568.
Applied Physics Letters, 51(20), 16 Nov. 1987, "Electroabsorption in AlGaAs/GaAs . . . transparent substrate", Lee et al., pp. 1582–1584.

*Primary Examiner*—Jerome Jackson
*Assistant Examiner*—Nathan K. Kelley
*Attorney, Agent, or Firm*—Nixon & Vanderhye

[57] ABSTRACT

An opto-electronic component comprises a substrate of InP (4, 5) with stacks of quantum wells (6) grown on both surfaces of the substrate. Layers (7) of n doped InP having p-doped regions (8) are formed on the outer surface of the quantum well structures. In use, voltages $V_1$ and $V_2$ may be applied to electrodes (1) enabling the component to be used for a number of applications, e.g. as a detector/modulator pair, in close coupled arrays of modulators, etc.

18 Claims, 2 Drawing Sheets

SEMI-CONDUCTOR STRUCTURES

This is a continuation of application Ser. No. 07/858,971, filed May 20, 1992, now abandoned.

FIELD OF THE INVENTION

This invention relates to semi-conductor structures, in particular to quantum well structures and more particularly to such structures capable of use, inter alia, as optical attenuators, optical modulators or tuneable detectors.

BACKGROUND OF THE INVENTION

A quantum well is, in its simplest form, a double heterostructure, with a layer of low band-gap material sandwiched between two layers of higher band-gap material. The layer of low band-gap material has a thickness, typically of 100 Angstroms or less thus providing a region of confinement for charge carriers in which the physical dimensions are such that quantum effects are significant.

By altering an electric field applied across a quantum well it is possible to move the optical absorption edge. Because a quantum well has a thickness of typically 100 Angstroms or less, the modulation depth which can be achieved with a single quantum well device is small. (The interactions for light incident normally on a single quantum well is extremely low.) Therefore devices usually, but not always, include stacks of 20 or more quantum wells in order to achieve a useful modulation depth. Such devices may be used as modulators and may be operated in reflection, transmission, or waveguide mode. In transmission mode light is incident normally on the device surface and passes through the device. In reflection mode devices are arranged so that light at an appropriate angle of incidence is reflected from or within the device. In waveguide mode light propagates parallel to the planes of the quantum well layers.

Typically, individual modulators made from multiple quantum wells may have optically active regions with diameters in the range 50 to 250 microns (micro-meters) or more, and may be constructed in the form of an array of devices. Ideally, such modulators or attenuators should on application of an electric field introduce an attenuation change of the order of 10 dB or more, although many devices will give adequate performance with less than 10 dB. By using pin diodes made from multiple quantum well structures, a 3 dB increase in absorption has been reported in planar GaInAs/InP modulators by applying a reverse bias of 30 volts (Electronic Letters Vol 24, pages 1583-1584 (1988)). These devices had an active region of diameter 60 microns. 4×4 arrays of such devices have been used to demonstrate transmission through a 100 M/bit per second −16 channel parallel interconnect system.

Although multiple quantum well modulators have been shown to operate at high speed, their use in the implementation of two dimensional arrays in systems have been limited by the combination low contrast ratio and high operating voltage. (Fabrication of multiple quantum well guides is a route to one dimensional arrays with improved characteristics—IKOGAKA et Al IEEE Photonics Tech Lett, Vol 1 (5), Pages 100-101 1989).

A known method of enhancing modulation for low applied voltage is to replace thin InGaAs wells (typically 60 Angstroms in width for operation at a wavelength of 1.5 microns) with coupled quantum wells. The separation of two sub-wells of thickness 30 Angstroms, by a thin (20 Angstrom) InP barrier, renders the quantum well wave functions more sensitive to an applied field.

SUMMARY OF THE INVENTION

The present invention permits production of modulators with an enhanced contrast ratio for a given bias.

According to one aspect of the present invention there is provided a quantum well structure characterised in that it comprises a stack of quantum wells located on one surface of a substrate, and at least one epilayer of semi-conductor formed on the opposite surface of the substrate.

According to another aspect of the present invention there is provided a multiple quantum well structure characterised in that stacks of quantum wells are located on opposite surfaces of a substrate.

Preferably modulators constructed from multiple quantum well structures of this type operate in transmission mode although modulators operating in reflective mode can be fabricated.

According to a further aspect of the present invention there is provided a multiple quantum well structure in which stacks of multiple quantum wells, fabricated from an InGaAs/InP system, are formed on opposite surfaces of a substrate, comprising n+ doped InP.

Substrates polished using conventional chemomechanical methods invariably have one face with a higher defect density and significantly more scratches than the other face. Substrates prepared in this way therefore have faces which differ substantially in their quality. Thus at first sight it is not reasonable to form multiple quantum well structures on opposite faces of a substrate. However, we have shown that in spite of this mismatch in surface quality, matched pairs of modulator arrays can be fabricated.

Present techniques for production of quantum well stacks place a limit on the number of wells that can be formed in a single stack. Variations in well thickness and the local electric field in the wells adversely affect device performance. We believe we have demonstrated that devices employing say, two stacks of n quantum wells have substantially better characteristics than devices employing a single stack of 2 n quantum wells.

The successful demonstration of double-sided epitaxially grown multiple quantum well structures suggests numerous novel applications. For example, in neural network applications, devices in two arrays could be separately addressed, yet be close coupled optically; furthermore, by operating devices on one side of the substrate as a detector array, an interface for InP based electronic processing of signals is provided on a single chip. Other possibilities include three level logic, and the fabrication of some complex optical circuits which have, up to now, been precluded by incompatible epitaxy or processing stages.

Although, as originally conceived, the invention is primarily concerned with opto-electronic modulators comprising stacks of multiple quantum wells located on both sides of a substrate, we have realised that the concept of aligned devices on opposite sides of a substrate has wider application. In some cases, e.g. where a quantum well laser forms one element of a device, or a modulator operates in the waveguide mode, a single quantum well may suffice to produce a useable device.

According to a further aspect of the present invention there is provided a semi-conductor structure comprising a substrate with at least one quantum well located on a first surface thereof and at least one epilayer of semi-conductor material located on an opposite surface of the substrate.

Preferably devices formed on the two surfaces of the above semi-conductor structure are in pre-determined spatial relationship.

It is of course possible to produce devices in which an optical hetrostructure is formed on one surface of the component and an electronic layer structure is formed on the other surface. The homostructure could, for example, provide electronic control for the optical elements of the device. Devices of this type, i.e. with optical processing elements and electronic processing elements on opposite sides of the same substrate are within the ambit of the invention.

BRIEF DESCRIPTION OF THE DRAWINGS

Embodiments of the invention will now be described in detail by way of example only with reference to the accompanying drawings, in which.

DETAILED DESCRIPTION OF THE DRAWINGS

Figure 1:
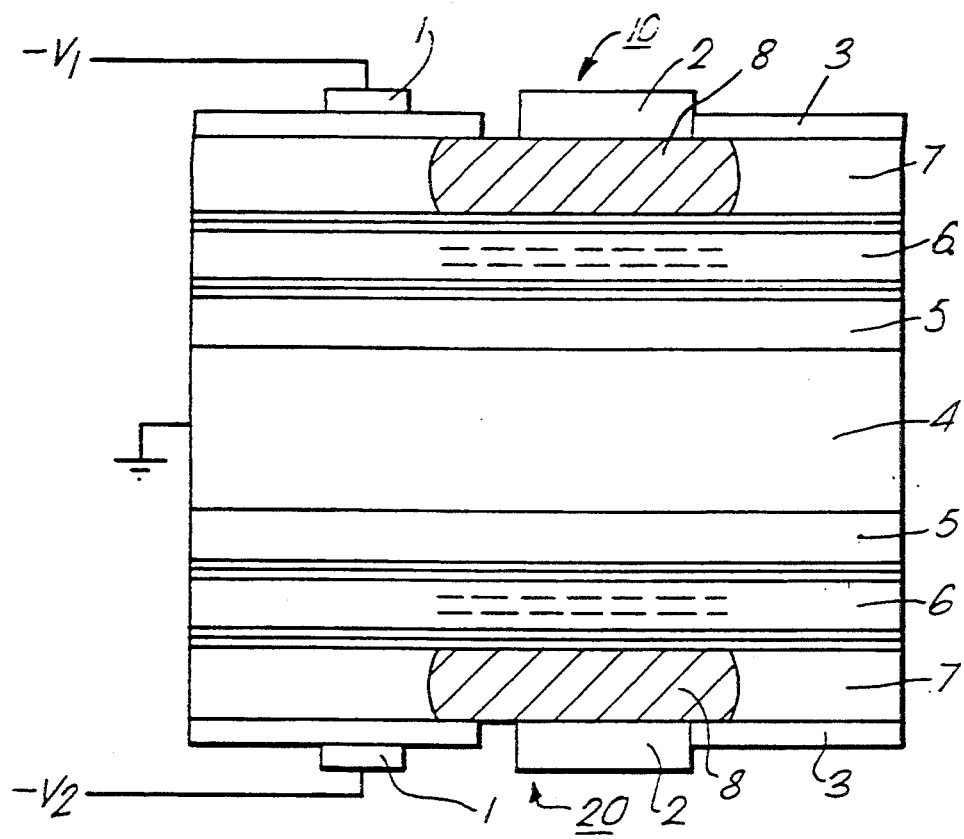
FIG. 1 illustrates a section through a single multiple quantum well modulator according to the invention.

Referring now to FIG. 1, a double-sided epitaxial multiple quantum well structure is grown on a substrate 4 which comprises n+ doped InP. Typically the substrate thickness is 250 microns. The substrate includes n+ doped InP buffer layers 5, of approximately 1 micron thickness on each surface. A stack of one hundred quantum wells 6 is formed on the buffer layers 5 from the InGaAs/InP system. Each quantum well has a thickness of 60 Angstroms and is separated from the adjacent quantum well by a barrier layer of material 60 Angstroms thick. The thickness of the multiple quantum well stacks 6 is approximately 1.2 microns. On the surface of each stack 6 there is formed a layer of n doped InP 7 having a region 8 doped with a p-type dopant, e.g. zinc by diffusion through a patterned mask of silicon nitride 3. The silicon nitride mask 3 is used to define a region of zinc diffusion which forms a pn junction. Typically the thickness of the layer 7 is 1 micron. The silicon nitride layer 3 also serves to protect the device from atmospheric attack. A thicker layer of silicon nitride 2 is formed as an anti-reflection coating on that part of the device on which light will be incident in operation. Leads are connected to the device at 1 and a third electrical connection is made to the substrate.

The optimum number of quantum wells in a stack is believed to be about 100, given the present state of fabrication technology, for devices operating at wavelengths at about 1.5 microns and using quantum wells with a spatial periodicity of 60 Angstroms, i.e. quantum wells having a width of 60 Angstroms and separated by barriers having a width of 60 Angstroms. The optimum number of quantum wells in a stack depends on the function of the device in which the stack is to be used, the periodicity of the well barrier structure, the semiconductor system from which the wells are fabricated, the fabrication technique itself, and the operating wavelength of the device. It is believed that for most applications the minimum number of quantum wells required to produce useful devices is 20, although in some situations a single quantum well may be sufficient. The upper limit for the number of quantum wells in a stack is believed to exceed 200, although we have only constructed quantum wells stacks containing up to 200 wells.

Production of devices according to the invention involves two sees of process stages. In the first set of processes a wafer having all the necessary epilayers is produced. In the second set of processes individual devices are formed on the wafer. The wafers are further processed to give either individual devices or arrays of devices.

Wafers according to the invention are prepared by mounting a polished InP substrate wafer in a gas source molecular beam epitaxy system using an indium-free method, with a backing wafer in close proximity. During growth the assembly is rotated to retain compositional uniformity. Gas source molecular beam epitaxy and associated techniques are well known in the art. After completing growth on the substrate surface which has the better finish, the wafer is reversed for epitaxial growth of layers 5, 6 and 7, on the other surface of the substrate, of course epilayers could be grown on the substrate surface with the poorer finish first. A piece of wafer may then be processed to determine the transmission spectrum through each of the multiple quantum wells stacks separately, by removal of the stack on the opposite face.

Devices are then formed on the processed wafer by depositing silicon nitride masks 3, on both faces of the wafer 10, 20, using a plasma method, the silicon nitride layer on side 10 is patterned using conventional photolithographic techniques. A pn junction is formed on the epilayer 7 by 1 micron deep zinc diffusion at low temperature and at atmospheric pressure. A pattern, matching that on surface 10 of the device, is formed on surface 20 using a standard double-sided mask aligner, and a pn junction is formed on surface 20 of the structure by zinc diffusion. It should be noted that double-sided mask aligners are normally used for production of metallization patterns and only produce through wafer alignment accuracies of the order of five microns, which is of course sufficient for the devices herein described which have active region diameters in the 50–250 micron range. Finally, anti-reflection coatings and metallization layers are deposited and patterned to complete the fabrication process. It should be noted that during etch processes on one surface of the structure, the other surface requires protection from the etchant, for example by mounting with an etch resistant wax onto a substrate such as silicon or a glass slide.

Electro-absorption spectra for 250 micron diameter devices indicate an optimum standing bias of minus 10 volts. Typically, by application of a further minus 10 volts to the corresponding modulators on both sides of the substrate, a modulation of 2.2 dB is measured on one side, and 1.6 dB on the other side. The difference in attenuation for the two sides of the device may reflect a "push-on" of the first diffusion, during the diffusion stage-for the second surface.

Techniques other than gas source molecular beam epitaxy may be used to grow quantum well stacks according to the invention. In particular, metal organic vapour phase epitaxy or metal organic molecular beam epitaxy may be used. Although modulators described in the present embodiment of the invention employ n-type substrates and devices are formed by p-doping, devices according to the invention could be produced using a p-type substrate and devices formed by n-doping, e.g. with sulphur or tin. Provided the n+ buffer layers 5 are sufficiently thick, the substrate could be of semi-insulating indium phosphide. It should be noted that a promising alternative semi-conductor system for implementation of the invention is the GaAlAs/GaAs system using GaP substrates. Although in embodiments of the invention described here pn junctions are formed by diffusion, devices according to the invention could have grown pn junctions, yielding a mesa structure. pn junctions, or np junctions used in devices according to the invention may of course be formed using techniques other than diffusion, e.g. ion implantation.

The result of the fabrication process is the device illustrated in FIG. 1. It should be noted that there are two independent control voltages, V1 and V2. The device can be regarded either as a single device, or as two aligned devices. It will thus be seen that multiple quantum well structures according to the present invention have a number of advantages and possible applications, in particular:

increasing the contrast ratio for a given voltage;

close coupling of two arrays of modulators for neural network or optical switching applications is easier with devices according to the invention than alignment of two separate arrays;

the use of two independently controlled voltages suggests applications in the design of three level optical logic systems;

an efficient detector modulator array pair is realisable by altering the growth times for one of the multiple quantum well structures, so that its absorption edge moves to slightly longer wavelengths, further epitaxial layers on this surface could provide an electronic processing plane, separate from, but coupled closely to, the modulator plane.

the device illustrated in FIG. 1 may be operated as a detector modulator pair by applying assymetric voltages to the two contacts 1, i.e. V1 unequal to V2.

Figure 3:
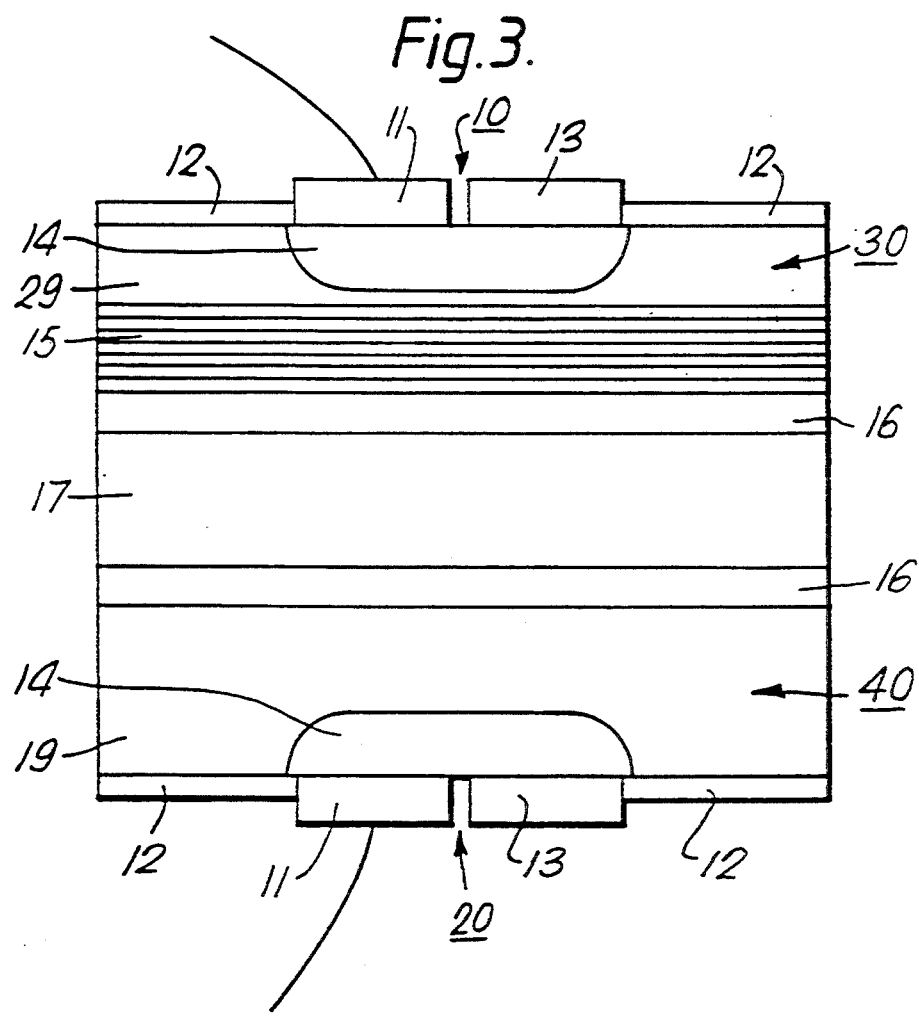
FIG. 3 illustrates a section through an aligned modulator detector pair according to the invention.

FIG. 3 shows a second embodiment of the invention. In this embodiment a modulator 30 is formed on a surface 10 of substrate 17, and a detector 40 is formed on surface 20 of substrate 17 and is aligned with the modulator 30.

The modulator comprises a buffer layer 16 formed on the substrate, a quantum well stack 15, and a layer of indium phosphide 29. A masking layer 12 is located on top of the layer of indium phosphide 29. A region of p-doped indium phosphide 14 is formed in layer 29. Contact pad 11 is located so that it makes contact with the region of p-doped indium phosphide. An anti-reflection window 13 is located over the region of p-doped indium phosphide 14, and serves to increase the percentage of light entering the active region of the device.

On the reverse surface 20 of the substrate there is formed an epitaxially grown indium phosphide buffer layer 16, and a layer of n-doped indium gallium arsenide or possibly indium gallium arsenide phosphide 19 in which is located a region of p-doped layer of similar composition, i.e. indium gallium arsenide or indium gallium arsenide phosphide 14. Depending on the precise mode of operation intended for the device, there may or may not be provided an anti-reflection coating window 13 on the surface of the p-doped region 19. A connection pad 11 is again provided at least overlapping part of the p-doped region of indium phosphide. A masking layer 12 which may be of silicon nitride is deposited on the surface of the device and serves to define a diffusion pattern, and also provides atmospheric protection.

It is proposed that devices of this type can be mounted, when fully processed, onto a pair of 18-pin chip carriers (with pre-drilled, aligned holes for light transmission) soldered back-to-back. A bond wire is then taken from each device to a gold pad on a lip below the outer perimeter of the appropriate carrier. The height of the bond wires are carefully limited so they do not protrude above the level of the outer perimeter. For use in systems applications it is suggested that spring loaded contacts be used to align with pre-existing edge connections on each of the chip carriers. Alternatively either a commercially available chip carrier socket or a purpose designed and fabricated socket could be used.

Figure 2:
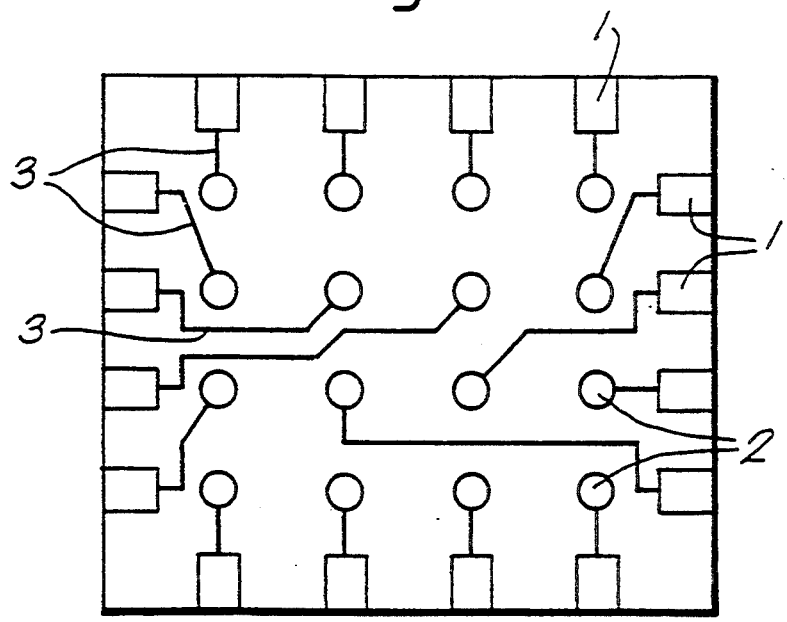
FIG. 2 illustrates in plan view a 4×4 array of multiple quantum well modulators according to the invention.

FIG. 2 shows in plan view an array of devices of the type illustrated in FIG. 1. The devices 2 are connected by bond wires 3 to gold pads 1 on the outer lip of a chip carrier. The device illustrated in FIG. 2 is a 4×4 array. However, other arrays are of course possible, for example 2×2, 1×4, or 10×10 etc.

An n+ doped InP substrate is chosen because it is transparent to light at wavelengths of interest (1.1 to 1.7 microns). Other substrates which provide an epitaxial match with the system used for growing the multiple quantum well stacks could be used as the substrate material. In particular, devices based on a GaP, silicon or GaAs substrates are possible. In the final analysis the only requirement is that the substrate be transparent at the wavelengths of interest. This normally requires the selection of a material which has a band edge equivalent wavelength lower than the wavelength of interest. The factors limiting choices of material for the substrate will be well understood by those skilled in the art. An excess mismatch between the substrate and the material system chosen for the quantum wells will result in the formation of dislocations and strains which may adversely affect performance of the device. However, a "controlled" strain layered system based on InGaAs quantum wells and GaAs barriers has been used, with acceptable performance, in modulators operating in transmissive mode and might therefore be used in the present invention. There is an extensive literature on strained epitaxial layers.

Finally, it should be noted that there are other techniques which can be used for enhancing the contrast ratio obtainable from multiple quantum well structures. Such techniques may in many cases be used in combination with the invention herein described. For example, in our co-pending application Ser. No. 8919989.7 there is described and claimed a quantum well structure having an intrinsic dipole. Such quantum well structures could be used in the present invention. By fabricating devices according to the present invention in the form of a Fabry Perot etalon further enhancements in contrast ratio may be obtained. Finally, the quantum wells used in devices of this type could be of the n-i-p-i type, i.e. comprising layers of n-doped semi-conductor, intrinsic semi-conductor, p-doped semi-conductor and intrinsic semi-conductor.

Although the invention is herein described principly in terms of a transmissive mode of operation with GaP and InP substrates, embodiments of the invention operating in reflective mode using for example GaAlAs/GaAs multiple quantum well modulators on GaAs substrates could be fabricated.

As described above, electrical fields are applied to devices by means of pn junctions. Devices according to the invention could employ Schottky barriers instead of pn junctions. Suitable Schottky barriers would include either an intermediate semi-conductor layer, e.g. a 700 angstrom epitaxial layer AlInAs on top of InP or a very thin insulating layer (tunnelling Schottky barrier).

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

We claim:

1. A quantum well optical device comprising:
   a substantially planar substrate;
   a first multi-layer structure on one side of the substrate, defining a stack of quantum wells configured as an array of individually addressable optical modulators;
   a second multi-layer structure on the other side of the substrate, defining a stack of quantum wells configured as an array of individual optical detectors;
   said modulators and detectors being arranged in pairs on opposite sides of the substrate, whereby incoming radiation is modulated by said modulator array to control individually the radiation that impinges upon the detectors.

2. A quantum well optical device comprising:
   a substantially planar substrate;
   a first multi-layer structure on one side of the substrate, defining a stack of quantum wells configured as an array of first optical elements;
   a second multi-layer structure on the other side of the substrate, defining a stack of quantum wells configured as an array of second optical elements;
   said first and second elements being arranged in pairs on opposite sides of the substrate, so as to provide optical coupling between the elements of each said pair.

3. A quantum well optical device comprising:
   a substantially planar substrate;
   a first, multi-layer structure on one side of the substrate, defining a stack of quantum wells configured as an array of optical elements; and
   a second layer structure on the other side of the substrate, defining a plurality of circuit elements in alignment with the optical elements in said first structure.

4. A quantum well device as claimed in claim 3 wherein said circuit elements comprise electronic processing elements.

5. A quantum well device as claimed in claim 3 wherein said circuit elements comprise optical processing elements.

6. A quantum well optical modulator device comprising:
   a substantially planar substrate;
   a first, multi-layer structure on one side of the substrate, defining a stack of quantum wells configured as a first array of individually addressable optical modulator elements; and
   a second, multi-layer structure on the other side of the substrate, defining a stack of quantum wells configured as a second array of individually addressable modulator elements in alignment with the modulator elements in said first array,
   whereby incoming radiation is spatially modulable in the plane of the substrate by pairs of said modulator elements from said first and second arrays with enhanced contrast ratio.

7. A quantum well device as claimed in claim 2 wherein each of the first and second multi-layer structures operates in response to optical radiation of a common frequency.

8. A quantum well optical device as in claims 1, 2, 3 or 6 wherein the quantum well stacks each include between 20 and 200 quantum wells.

9. A quantum well optical device as in claims 1, 2, 3 or 6 wherein the quantum well stacks each contain about 100 quantum wells.

10. A quantum well optical device as in claims 1, 2, 3 or 6 wherein the substrate is n or n+ doped indium phosphide and the multiple quantum wells are formed from an indium gallium arsenide/indium phosphide system.

11. A quantum well optical device as in claims 1, 2, 3 or 6 wherein the substrate is gallium phosphide and the multiple quantum wells are formed from a gallium aluminum arsenide/gallium arsenide system.

12. A quantum well optical device as in claims 1, 2, 3 or 6 wherein the substrate is silicon.

13. A quantum well optical device as in claims 1, 2, 3 or 6 wherein the substrate is gallium phosphide.

14. An array of quantum optical devices as in claims 1, 2, 3 or 6 wherein the devices are formed on a common substrate.

15. A quantum well optical device as in claims 1, 2, 3 or 6 wherein the device is mounted on a pair of chip carriers connected back-to-back and having aligned holes for light transmission.

16. A three level optical logic system comprising a quantum well optical device, said quantum well optical device including:
   a substantially planar substrate;
   a first multi-layer structure on one side of the substrate, defining a stack of quantum wells configured as an array of first optical elements;
   a second multi-layer structure on the other side of the substrate, defining a stack of quantum wells configured as an array of second optical elements;.
   said first and second elements being arranged in pairs on opposite sides of the substrate, so as to provide optical coupling between the elements of each said pair without substantial cross coupling between adjacent pairs.

17. A neural network comprising a quantum well optical device, said quantum well optical device including:
   a substantially planar substrate;
   a first multi-layer structure on one side of the substrate, defining a stack of quantum wells configured as an array of first optical elements;
   a second multi-layer structure on the other side of the substrate, defining a stack of quantum wells configured as an array of second optical elements;
   said first and second elements being arranged in pairs on opposite sides of the substrate, so as to provide optical coupling between the elements of each said pair without substantial cross coupling between adjacent pairs.

18. A detector-modulator array pair incorporating a quantum well optical device as in claims 2, 3 or 6.

* * * * *